United States Patent
Parker (10) Patent No.: US 11,404,135 B1
(45) Date of Patent: Aug. 2, 2022

(54) RUNTIME IDENTIFICATION OF BAD MEMORY CELLS BASED ON DIFFERENCE BETWEEN DATA PATTERN AND READ DATA

(71) Applicant: Amazon Technologies, Inc., Seattle, WA (US)

(72) Inventor: Jonathan Parker, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/792,770

(22) Filed: Feb. 17, 2020

(51) Int. Cl.
| G11C 29/42 | (2006.01) |
| G11C 29/02 | (2006.01) |
| G11C 29/44 | (2006.01) |
| G06F 9/54 | (2006.01) |
| G11C 29/00 | (2006.01) |
| G06F 11/10 | (2006.01) |
| G11C 29/12 | (2006.01) |

(52) U.S. Cl.
CPC ............ *G11C 29/42* (2013.01); *G06F 9/546* (2013.01); *G06F 11/108* (2013.01); *G11C 29/025* (2013.01); *G11C 29/44* (2013.01); *G11C 29/789* (2013.01); *G11C 2029/1208* (2013.01)

(58) Field of Classification Search
CPC .................. G06F 9/546; G06F 11/108; G11C 2029/1208; G11C 29/52
See application file for complete search history.

(56) References Cited

U.S. PATENT DOCUMENTS

| 7,328,384 B1* | 2/2008 | Kulkarni ........ G01R 31/318519 |
| | | 714/725 |
| 8,885,426 B1* | 11/2014 | Burstein ................ G11C 29/44 |
| | | 365/201 |
| 10,204,700 B1* | 2/2019 | Oh .................... G11C 29/56008 |
| 2010/0257432 A1* | 10/2010 | Resnick .............. G06F 11/1008 |
| | | 714/777 |
| 2011/0185125 A1* | 7/2011 | Jain ..................... G06F 12/0811 |
| | | 711/122 |
| 2014/0149826 A1* | 5/2014 | Lu ......................... G06F 11/108 |
| | | 714/764 |
| 2019/0019569 A1* | 1/2019 | Pope ..................... G11C 29/52 |

\* cited by examiner

*Primary Examiner* — Sultana Begum
(74) *Attorney, Agent, or Firm* — Klarquist Sparkman, LLP (57) ABSTRACT

Technologies are provided for runtime identification of bad memory cells. An uncorrectable error can be detected in data stored in a plurality of memory cells of a memory device. Patterned data can be written to the plurality of memory cells that stored the data in which the uncorrectable error was detected. The data stored in the plurality of memory cells can be read and compared to the patterned data. One or more of the memory cells can be identified as bad memory cells based on differences between the patterned data and the data read from the plurality of memory cells. In at least some embodiments, the one or more identified bad memory cells can be omitted from subsequent data storage operations. Additionally or alternatively, the one or more identified bad memory cells can be repaired, for example, by using a post-package repair operation.

18 Claims, 6 Drawing Sheets

RUNTIME IDENTIFICATION OF BAD MEMORY CELLS BASED ON DIFFERENCE BETWEEN DATA PATTERN AND READ DATA

BACKGROUND

At least some computer memory devices contain memory cells (such as transistors) that store bits of data. Examples of such memory devices include dynamic random access memory (DRAM) modules. It is possible for the hardware components of memory cells of a memory device to fail. This can result in errors in data stored in the memory cells. At least some memory devices (such as error-correcting code (ECC) memory devices) can store additional data (such as ECC bits) that can be used to detect, and in some cases correct, errors in stored data.

At least some memory device manufacturers use test equipment to write test patterns to memory cells of memory devices to test whether the memory devices are functioning properly before distributing them.

DETAILED DESCRIPTION

Memory cells of computer memory devices can experience hardware failures that result in the introduction of errors into stored data. At least some memory devices (such as ECC memory devices) can detect, and in some cases correct, errors caused by such bad memory cells. However, in some cases, errors in stored data occur that cannot be corrected. For example, in the case of an ECC memory, an error may be detected that is caused by the corruption of more than one bit of data and, thus, cannot be corrected by the use of associated ECC bits. In many cases, the only recourse for dealing with uncorrectable errors may be to replace the memory device since a root cause of an uncorrectable error is not readily identifiable.

At least some of the technologies described herein can be used to address this problem. For example, a memory controller can be configured to detect an uncorrectable error in data stored in a plurality of memory cells of a memory device. The memory controller can be configured to write patterned data to the plurality of memory cells that stored the data in which the uncorrectable error was detected. The memory controller can read the data stored in the plurality of memory cells and compare the data read from the plurality of memory cells to the patterned data. The memory controller can identify one or more of the memory cells that is/are bad based on differences between the patterned data and the data read from the plurality of memory cells. For example, if the memory controller wrote a bit value of 1 (one) to a memory cell but read a bit value of 0 (zero) from the memory cell, the memory controller can determine that the memory cell is not functioning properly and can classify it as a bad memory cell.

In at least some embodiments, the one or more identified bad memory cells can be omitted from subsequent data storage operations. Thus, in at least some cases, it is possible to continue to use the memory device by avoiding use of the bad memory cells that caused the uncorrectable error.

In a different or further embodiment, the one or more identified bad memory cells can be repaired. For example, identities of one or more bad memory cells can be sent to a boot firmware (such as a BIOS) of a computing device to which the memory device is connected. The boot firmware can be configured to perform a post-package repair operation targeting the one or more bad memory cells. Such a post-package repair operation can be performed during a subsequent boot (or reboot) operation.

Figure 1:
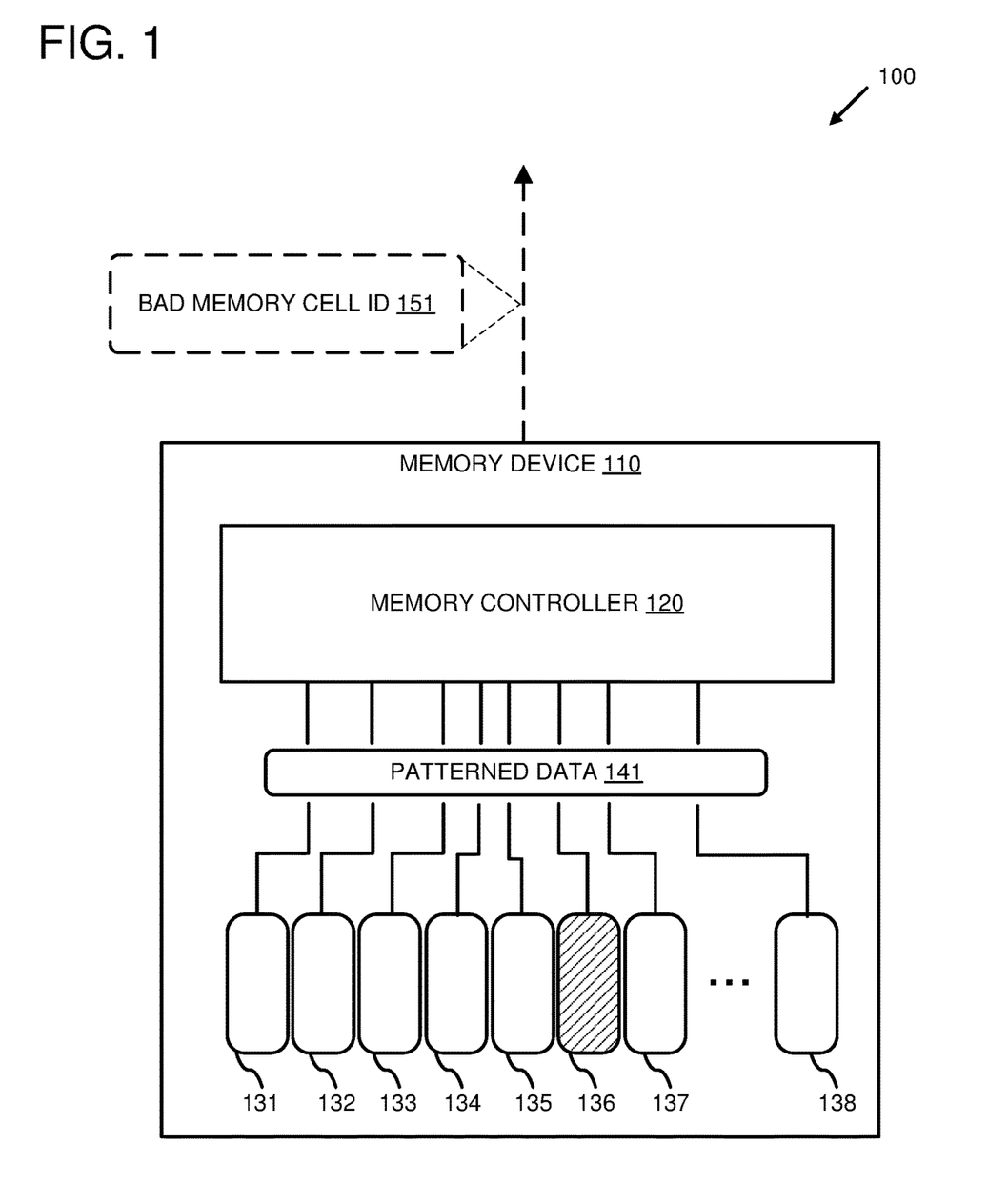
FIG. 1 is a system diagram depicting an example memory device configured to identify one or more bad memory cells.

FIG. 1 is a system diagram depicting an example system 100 comprising a memory device 110 configured to identify one or more bad memory cells. The memory device 110 comprises a memory controller 120 and a plurality of memory cells 131-138 configured to store data. For example, the memory cells 131-138 can be configured to store individual bits of data representing binary values (e.g., 1's and 0's). The representations of the memory cells 131-138 in FIG. 1 are presented for illustration purposes and are not intended to depict an accurate physical layout of the memory cells 131-138 in the memory device 110. The number of memory cells 131-138 depicted in FIG. 1 is not intended to be limiting. Other numbers of memory cells are possible. In at least some embodiments, the memory cells 131-138 can be organized into a plurality of memory chips, memory banks, or memory pages (not depicted). In a particular embodiment, the memory device 110 comprises a dynamic random access memory (DRAM) module.

Techniques described herein do not necessarily involve all memory cells of the memory device 110, and may target a subset of the memory cells of the memory device 110. For example, the memory controller 120 may be configured to access the memory cells 131-138 using logical data units (such as address lines, cache lines, memory pages, etc.). In such embodiments, access operations targeting the plurality of memory cells 131-138 may be limited to operations targeting memory cells of the memory device 110 in a particular logical data unit, or a plurality of logical data units, that represent a subset of the memory cells of the memory device 110.

The memory controller 120 can be configured to process data access operations targeting the plurality of memory cells 131-138. Such data access operations can include operations to store data in the plurality of memory cells 131-138 and to retrieve data from the plurality of memory cells 131-138.

The memory controller 120 can be configured to detect an uncorrectable error in data stored in the plurality of memory cells 131-138. For example, the memory controller 120 can be configured to store additional data for use in correcting errors caused by the storage of data in the plurality of memory cells 131-138 (such as error-correcting codes (ECCs) or the like). However, in at least some scenarios, an error may be detected in the data stored in the plurality of memory cells 131-138 that cannot be corrected using the additional error-correcting data. For example, an error-correcting code may be usable for correcting a single bit error but unusable to correct an error that involves the corruption of multiple bits of data stored in the plurality of memory cells 131-138. Other example techniques for detecting errors in stored data include the use of parity bits, checksums, etc.

Responsive to detecting the uncorrectable error, the memory controller 120 can write bits of data conforming to a data pattern (e.g., patterned data 141) to the plurality of memory cells 131-138. Although the memory controller 120 is depicted in FIG. 1 as interfacing with the plurality of memory cells 131-138 using multiple parallel communication lines, in at least some embodiments it is possible for the memory controller 120 using a different number of communication lines (such as by using a serial interface and/or one or more shift registers).

The memory controller 120 can read bits of data stored in the plurality of memory cells 131-138. The memory controller 120 can determine if there are any differences between the bits of data retrieved from the memory cells 131-138 and the bits of data conforming to the data pattern that were written to the memory cells 131-138. In at least some embodiments, multiple write operations can be performed using bits of data conforming to different data patterns, followed by subsequent read operations to retrieve the bits of data actually stored in the plurality of memory cells 131-138. Retrieved data can be compared to the last-written data pattern. The process can then repeat for each data pattern.

The memory controller 120 can identify one or more memory cells, of the plurality of memory cells 131-138, that is/are a cause of the uncorrectable error based on any differences that are detected between the bits of data conforming to the data pattern (or patterns) that are written to the plurality of memory cells 131-138 and the bits of data read from the plurality of memory cells 131-138. For example, in FIG. 1 the memory cell 136 is depicted as being a cause of the uncorrectable error based on a difference between a data bit written to the memory cell 136 as part of the patterned data 141 and a data bit subsequently read from the memory cell 136. Although a single bad memory cell (136) is depicted as identified in FIG. 1, using the patterned data 141, it is possible in at least some scenarios to detect multiple memory cells, of the plurality of memory cells 131-138, that are bad.

Optionally, the memory device 110 can be configured to transmit a message 151, reporting the one or more identified bad memory cells. For example, the message 151 can comprise identifiers for the one or more bad memory cells. An identifier for a memory cell can comprise an addresses, a combination of an address line and a memory cell offset value, etc. The message 151 can be transmitted to an operating system and/or firmware of a computing device (not shown) that is connected to the memory device 110.

In a different or further embodiment, the memory controller 120 can be configured to avoid the use of the identified one or more memory cells in future data storage operations. For example, the memory controller 120 can mark the memory cell 136 as being "offline" after it has been identified as a bad memory cell. Additionally or alternatively, the bad memory cell can be marked as "offline" by a host computer connected to the memory device 110.

In at least some embodiments, avoiding the use of the identified one or more memory cells can comprise avoiding the use of all memory cells in a logical data unit (such as an address line, a cache line, a memory page, etc.) that includes the identified one or more memory cells. Such logical data units can represent fundamental levels of access to the memory cells 131-138 in the memory device 110. For example, data access commands processed by the memory controller 120 may write data to all memory cells in an identified logical data unit and/or read and return data from all memory cells in an identified logical data unit.

In an embodiment where the plurality of memory cells 131-138 are organized in multiple logical data units, the memory controller 120 can infer, based on the identification of one or more bad memory cells in one cache line, that one or more memory cells in one or more other logical data units may be bad as well. The memory controller 120 can be configured to write patterned data to memory cells in the one or more other logical data units and read data back from them in order to confirm whether or not additional bad memory cells exist in the one or more other logical data units. Additionally or alternatively, the memory controller 120 can be configured to avoid the use of the one or more other logical data units in future data storage operations as well.

Additionally or alternatively, the memory controller 120 can be configured to repair the one or more identified memory cells, such as by performing a post-package repair operation. For example, the memory controller 120 can transmit a message to a host computer connected to the memory device 110, reporting the identified one or more memory cells (e.g., message 151). In response, the memory controller 120 can receive a command from the host computer to perform a repair operation targeting the identified one or more memory cells. In at least one such embodiment, the command to perform the repair operation is received after rebooting the memory device 110.

In any of the examples described herein, a memory controller can comprise one or more hardware components configured to access data stored in a hardware memory (such as a plurality of memory cells storing bits of data). The memory controller can be configured to perform operations to write data (such as bits of data) to the hardware memory and/or read data (such as bits of data) from the hardware memory. In at least some embodiments, the memory controller can comprise a firmware stored in a read-only memory (ROM) or flash memory. Additionally or alternatively, the memory controller can be implemented at an intermediate layer between an application (such as an operating system or firmware) and a memory device comprising the hardware memory. Such an intermediate layer controller can comprise software (such as a driver) and one or more processors, a system-on-chip (SoC), a field-programmable gate array (FPGA), and/or an application-specific integrated circuit (ASIC). In some embodiments, the memory controller can be part of an application (such as an operating system or firmware). In such an embodiment, the application may use the memory controller to access a hardware memory directly, without using an intermediate layer, such as a driver. The memory controller can be located on a computer containing the hardware memory, or on a separate computer that is connected to the hardware memory via a communication channel, such as a computer network.

In any of the examples described herein, a memory device can be a device comprising a plurality of memory cells. Example memory devices include random access memory devices (such as random access memory (RAM) modules, dynamic random access memory (DRAM) modules, double data rate synchronous DRAM (DDR SDRAM) modules, error-correcting code (ECC) memory devices, etc.) Memory cells in a memory device can be configured to store individual bits of data. In at least some embodiments, memory cells in a memory device can comprise transistors configured to store electric charges that represent data bits. At least some memory devices comprise memory controllers that are configured to receive and process data access requests targeting the plurality of memory cells.

In any of the examples described herein, a host computer can be a server or other computing device that comprises a processor and is connected to a memory controller. The host computer can be configured to transmit commands, such as processing commands, communication commands, data access commands (i.e., commands to perform data read and write operations), inquiry commands, firmware update commands, or the like, to the memory controller. The host computer can be configured to receive command responses from the memory controller. The connection can be a direct connection, such as a cable or bus connection, an indirect connection, such as a connection over a network, or some combination thereof. In scenarios where the host computer is connected to more than one memory controller, the various connections can be of the same type or different types.

In at least some embodiments, the host computer can comprise a motherboard to which a processor and a memory device comprising a memory controller are connected. In such an embodiment, the processor of the host computer can be configured to access the memory device via one or more communication bus lines of the motherboard. The host computer can comprise an operating system comprising instructions that, when executed by the processor, cause the processor to access the memory device. In a different or further embodiment, the host computer comprises a boot firmware (such as a BIOS, or the like) that is configured to access the memory device. The boot firmware can be configured to perform operations to test, initialize, and/or repair the memory device.

Figure 2:
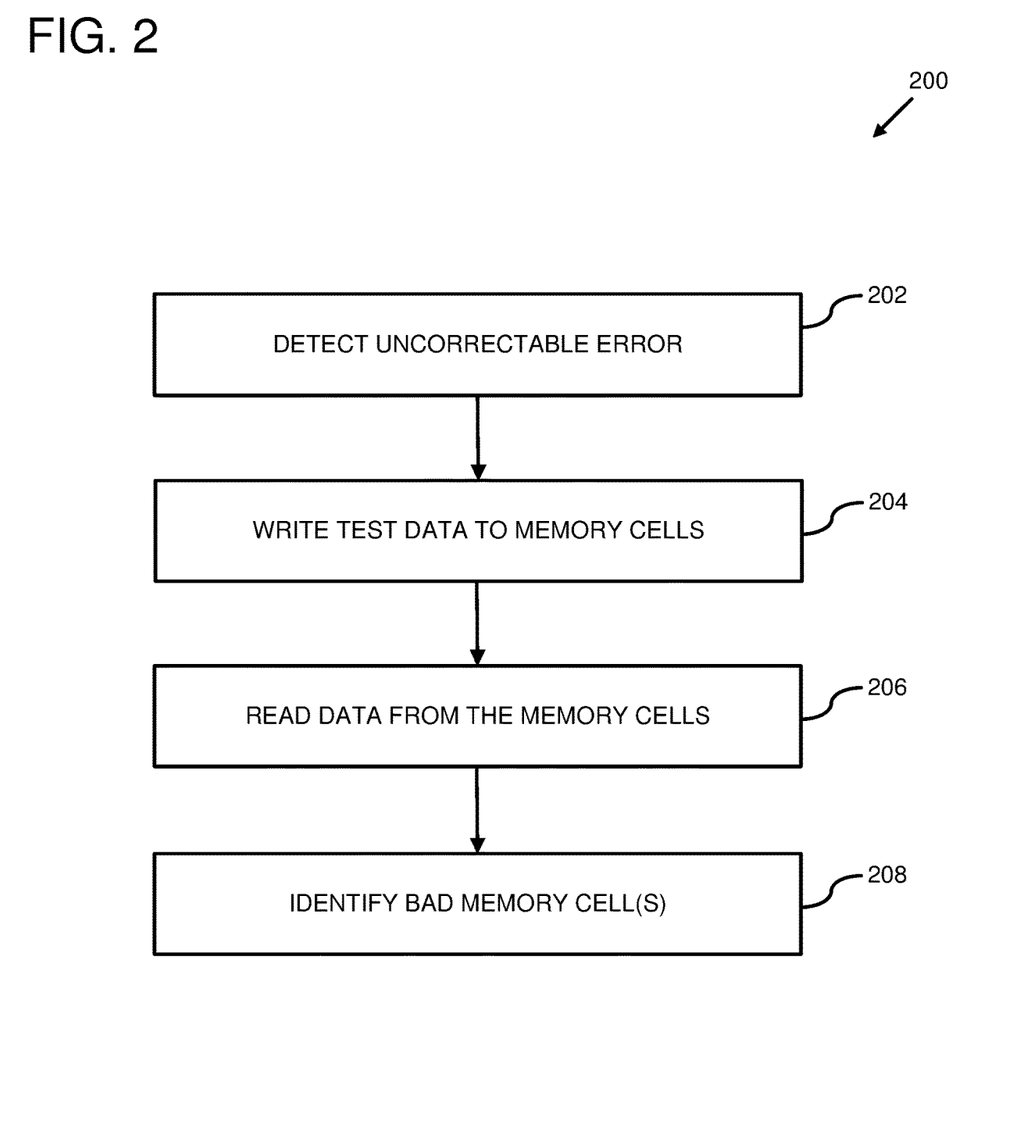
FIG. 2 is flowchart of an example method for identifying one or more bad memory cells.

FIG. 2 is flowchart of an example method 200 for identifying one or more bad memory cells. Any of the example systems described herein can be used to perform the example method 200. For example, the memory device 110 can be used to perform all or part of the example method 200. For example, the example system 400 depicted in FIG. 4 can be used to perform all or part of the example method 200.

At 202, an uncorrectable error in data stored in a plurality of memory cells of a memory device (such as a random access memory device) is detected. For example, the memory controller 120 can detect an uncorrectable error in data stored in the plurality of memory cells 131-138 of the memory device 110. Detecting the uncorrectable error can comprise detecting an error which cannot be corrected using an error-correcting code (ECC). For example, the error can be detected in data stored in memory cells of an ECC memory device. After detecting the error, it can be determined that the correct data cannot be recovered using an ECC associated with the data in which the errors were detected.

At 204, responsive to detecting the uncorrectable error, test data is written to the plurality of memory cells. For example, the memory controller 120 can write test data 141 to the plurality of memory cells 131-138. The test data can comprise patterned data. In at least some embodiments, a memory controller can be configured to write the test data to the plurality of memory cells immediately after detecting the uncorrectable error. Additionally or alternatively, the uncorrectable error can be reported to a component of a computing device to which the memory device is connected (such as an operating system, a firmware, etc.). In such an embodiment, a command can be received from the component of the computing device to write the test data to the plurality of memory cells. For example, the command to write the test data to the plurality of memory cells can be received as part of a reboot (or initialization) operation targeting the memory device.

At 206, data is read from the plurality of memory cells. In at least some embodiments, the steps of writing test data to the plurality of memory cells and reading data from the plurality of memory cells can be repeated multiple times. For example, a same pattern of data can be written to the plurality of memory cells multiple times and, after each time, the data values currently stored in the memory cells can be retrieved. Additionally or alternatively, different data patterns can be written to the plurality of memory cells. For example, the various data patterns may be more effective than others for detecting certain types of memory cell hardware failures. For example, writing patterned data that comprises writing a series of ones (1's) to the plurality of memory cells may detect certain hardware failures, while writing patterned data that comprises writing a series of zeros (0's) to the plurality of memory cells may detect other hardware failures. Other examples of patterned data include writing patterns of alternating ones of zeros to the plurality of memory cells. Other kinds of test data are also possible.

At 208, one or more bad memory cells is/are identified that is/are the cause of the uncorrectable error, based on differences between the data read from the plurality of memory cells and the test data. For example, if a series of ones (1's) are written to the plurality of memory cells, one or more memory cells associated with zero (0) values in the data read from the plurality of memory cells can be identified as bad memory cells. For example, if a series of zeros (0's) are written to the plurality of memory cells, one or more memory cells associated with one (1) values in the data read from the plurality of memory cells can be identified as bad memory cells.

In at least some embodiments, a message identifying the one or more identified bad memory cells can be transmitted to a component of a host computer connected to the memory device (such as an operating system of the host computer, a firmware of the host computer, etc.).

Figure 3:
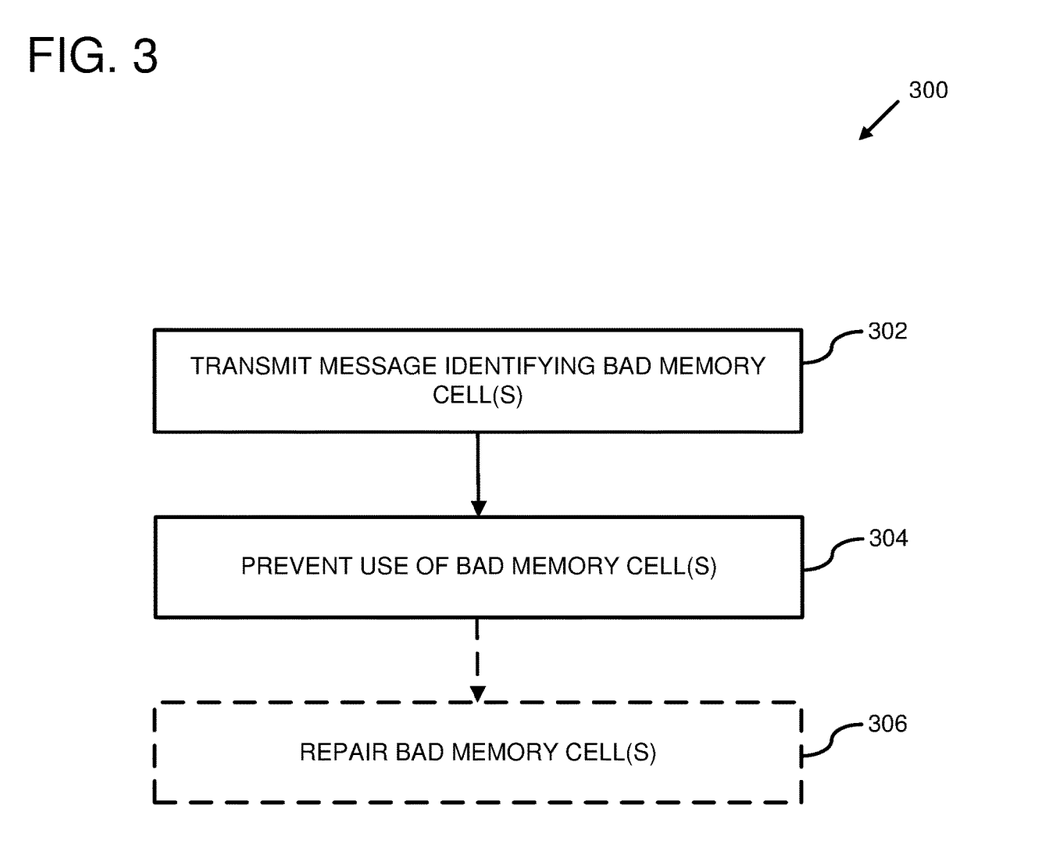
FIG. 3 is a diagram depicting a flowchart of an example method for mitigating one or more bad memory cells.

FIG. 3 is a diagram depicting a flowchart of an example method 300 for mitigating one or more bad memory cells. Any of the example systems described herein can be used to perform the example method 300. For example the memory device 110 can be used to perform all or part of the example method 300. For example, the example system 400 depicted in FIG. 4 can be used to perform all or part of the example method 300.

Figure 4:
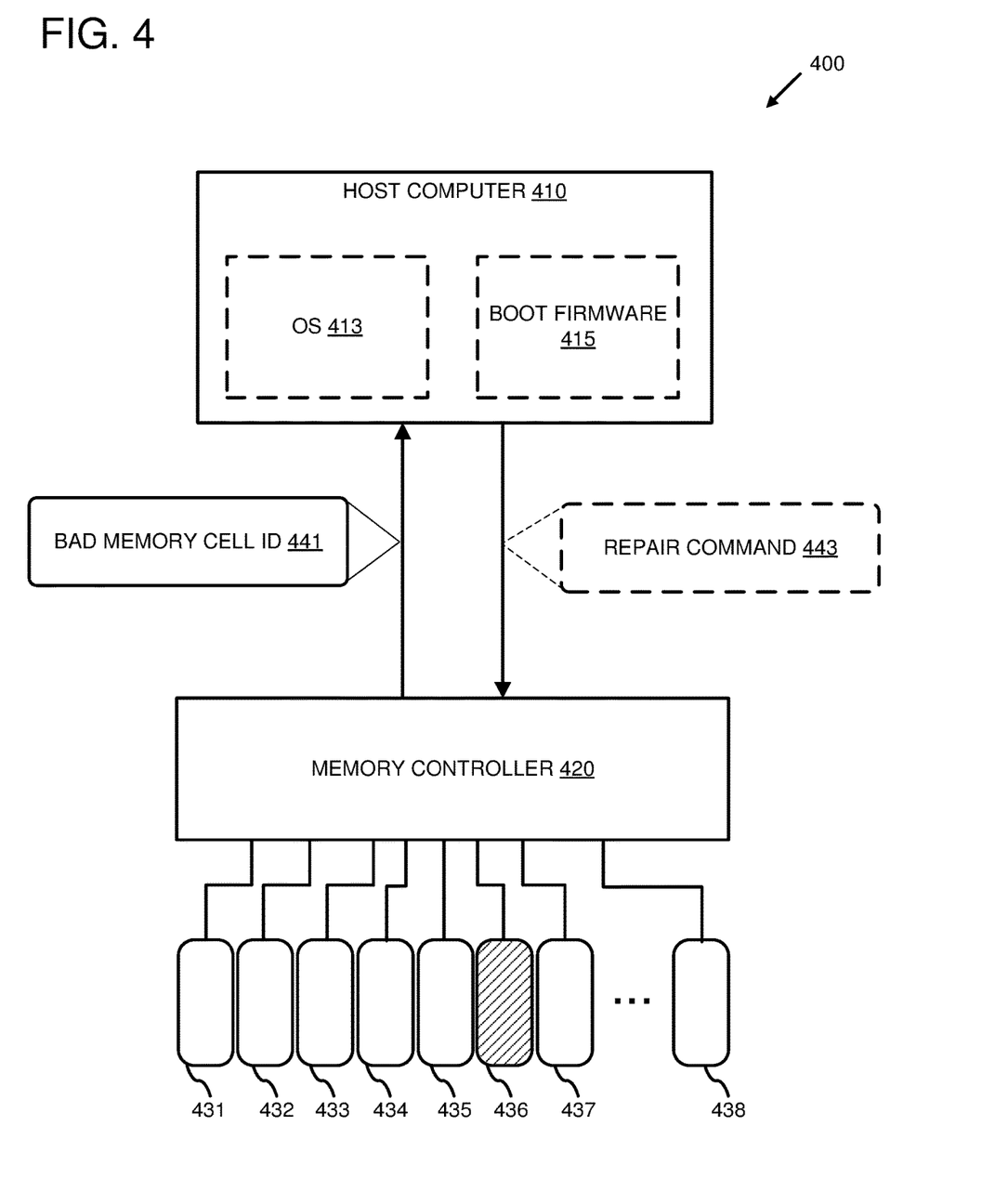
FIG. 4 is a system diagram depicting an example system comprising a host computer, a memory controller, and a plurality of memory cells.

FIG. 4 is a system diagram depicting an example system 400 comprising a memory controller 410 and a plurality of memory cells 421-425. The example system 400 further comprises a host computer 410 configured to communicate with the memory controller 420. The host computer 410 can be configured to transmit commands to the memory controller 420 to store data in the plurality of memory cells 431-438 and/or retrieve data from the plurality of memory cells 431-438. Responsive to receiving such commands, the memory controller 420 can be configured to perform operations to retrieve data from and/or write data to the plurality of memory cells 431-438. Optionally, the host computer 410 can comprise an operating system 413. The operating system 413 can comprise instructions that, when executed by a processor (not shown) of the host computer 410, cause the processor to transmit one or more data access commands to the memory controller 420. Optionally, the host computer 410 can comprise a boot firmware 415. In at least some embodiments, the boot firmware 415 can be configured to access the memory controller 420 as part of a boot process in order to initialize the plurality of memory cells 431-438.

The memory controller 420 can be configured to detect an uncorrectable error in data stored in the plurality of memory cells 431-438. Responsive to such a detection, the memory controller 420 can be configured to write patterned data (such as a bit pattern) to the plurality of memory cells 431-438 and to read data from the plurality of memory cells 431-438. The memory controller 420 can identify one or more bad memory cells (e.g., 436) based on differences between the patterned data and the data read from the plurality of memory cells 431-438.

Referring to FIG. 3, at 302, a message is transmitted identifying one or more bad memory cells. For example, the memory controller 420 can transmit the message 441, comprising one or more bad memory cell identifiers, to the host computer 410. In at least some embodiments, the one or more bad memory cell identifiers can be transmitted to the operating system 413 of the host computer 410. Additionally or alternatively, the one or more bad memory cell identifiers can be stored in a log that is accessible by the boot firmware 415.

In at least some embodiments, a plurality of memory cells (e.g., 431-438) are organized into multiple logical data units (such as address lines, cache lines, memory pages, etc.). A logical data unit can represent a fundamental level of data access for accessing data stored in the plurality of memory cells. Example logical data unit sizes include 64 bits, 512 bits, etc. In at least some embodiments, the logical data unit can be the level at which the uncorrectable error is detected. For example, in an example ECC memory device, a logical data unit can contain 576 bits (including 512 data bits and 8 ECC bits). In an embodiment where memory cells are accessed in logical data units, the message identifying the one or more bad memory cells can comprise an identifier of a logical data unit containing the one or more bad memory cells (or identifiers of multiple logical data units containing the bad memory cells if the bad memory cells are not all contained in a single logical data unit).

At 304, the use of the one or more bad memory cells to store data is prevented. For example, the host computer 410 can avoid the use of the one or more bad memory cells (e.g., 436) for storing data in future memory access operations. In an embodiment where the plurality of memory cells (e.g., 431-438) are organized into logical data units (such as address lines, cache lines, memory pages, etc.), a logical data unit containing the one or more bad memory cells can be omitted from future memory access operations. In a particular embodiment, the plurality of memory cells are organized into multiple cache lines and omitting one or more bad memory cells comprises omitting a cache line comprising the one or more bad memory cells from use in a future data write operation.

Optionally, at 306, the one or more bad memory cells are repaired. In at least some embodiments, a post-package repair operation targeting the one or more bad memory cells can be performed. For example, the boot firmware 415 of the host computer 410 can be configured to transmit a command 443 to the memory controller 420 to perform a post-package repair operation targeting the one or more bad memory cells (e.g., 436). In at least some such embodiments, the post-package repair operation can be performed subsequent to a reboot of a memory device containing the plurality of memory cells. For example, the boot firmware 415 of the host computer 410 can be configured to transmit the command 443 to the memory controller 420 as part of a reboot operation of a memory device (not shown) comprising the memory controller 420 and the plurality of memory cells 431-438.

Figure 5A:
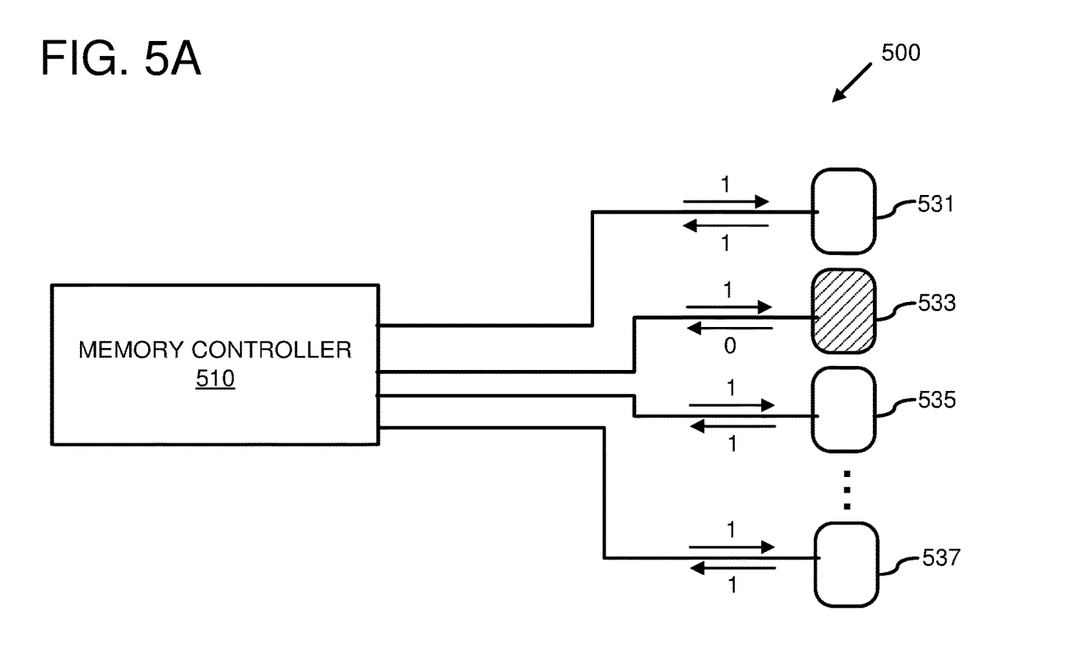
FIGS. 5A-B are system diagrams depicting an example system comprising a memory controller configured to generate patterned data for identifying one or more bad memory cells.

FIG. 5A is a diagram depicting an example system 500 comprising a memory controller 510 configured to generate patterned data for detecting one or more bad memory cells in a plurality of memory cells 531-537. The plurality of memory cells 531-537 can be memory cells in which an uncorrectable data error was detected (for example, memory cells in a logical data unit (such as an address line, a cache line, a memory page, etc.) storing data that contains an uncorrectable error). The memory controller 510 is configured to write patterned data comprising a series of ones (1's) to the plurality of memory cells 531-537 and to then read the data contained in the plurality of memory cells 531-537. The memory controller 510 is further configured to identify one or more of the plurality of memory cells 531-537 that is bad, and thus is a cause of the uncorrectable data error, based on differences between the patterned data and the data read from the plurality of memory cells 531-537. For example, in FIG. 5A, a value of one (1) is written to the memory cell 533, but a value of zero (0) is read from the memory cell 533. Based on this difference, the memory controller 510 can determine that the memory cell 533 is bad and, thus, a cause of the uncorrectable error.

Figure 5B:
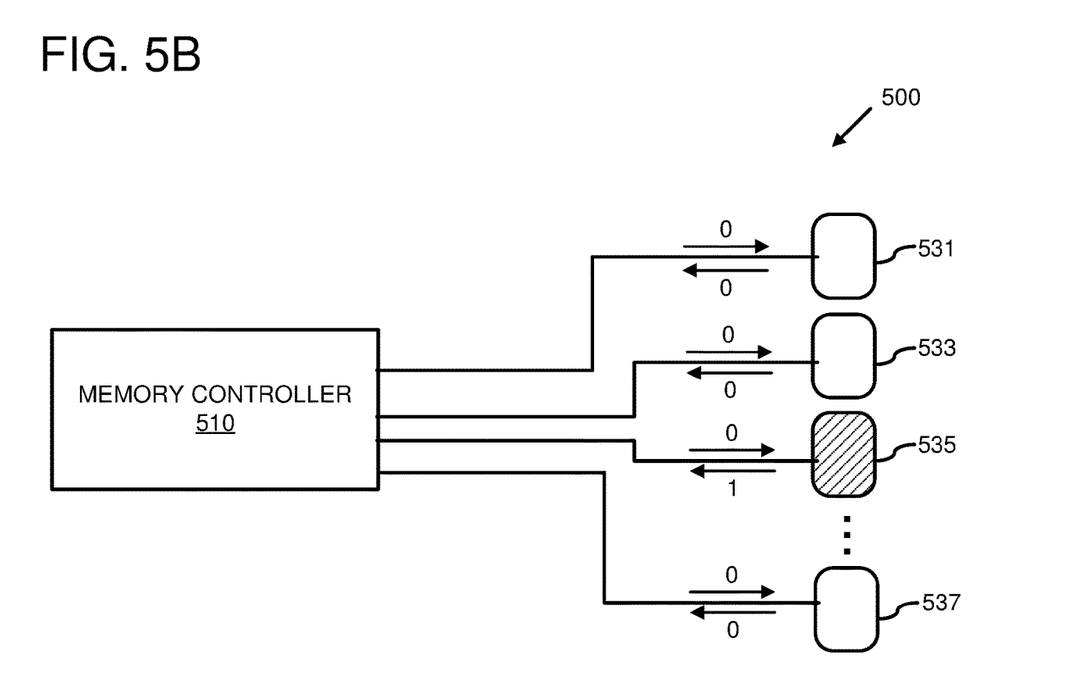

FIG. 5B is a diagram depicting the example system 500, wherein the memory controller 510 is configured to a write patterned data to the plurality of memory cells 531-537 comprising a series of zeros (0's). The memory controller 510 is configured to then read data contained in the plurality of memory cells 531-537 and to identify one or more of the plurality of memory cells 531-537 that is bad based on differences between the patterned data and the data read from the memory cells 531-537. For example, in FIG. 5B, a value of zero (0) is written to the memory cell 535, but a value of one (1) is read from the memory cell 535. Based on this difference, the memory controller 510 can determine that the memory cell 535 is bad and, thus, is a cause of the uncorrectable error.

Other types of patterned data can also be used. Examples of other types of patterned data include a series of alternating ones (1's) and zeros (0's) that are written to the plurality of memory cells 531-537. Other bit patterns are also possible, such as a walking ones pattern, a walking zeros pattern, etc. In at least some embodiments, more than one pattern of data is written to the plurality of memory cells 531-537. After a given pattern of data is written to the plurality of memory cells 531-537, the data stored in the plurality of memory cells 531-537 can be read back. In a different or further embodiment, a given pattern of data can be written to the plurality of memory cells 531-537 multiple times. In at least some cases, such a technique can be useful for detecting memory cells that fail intermittently.

Figure 6:
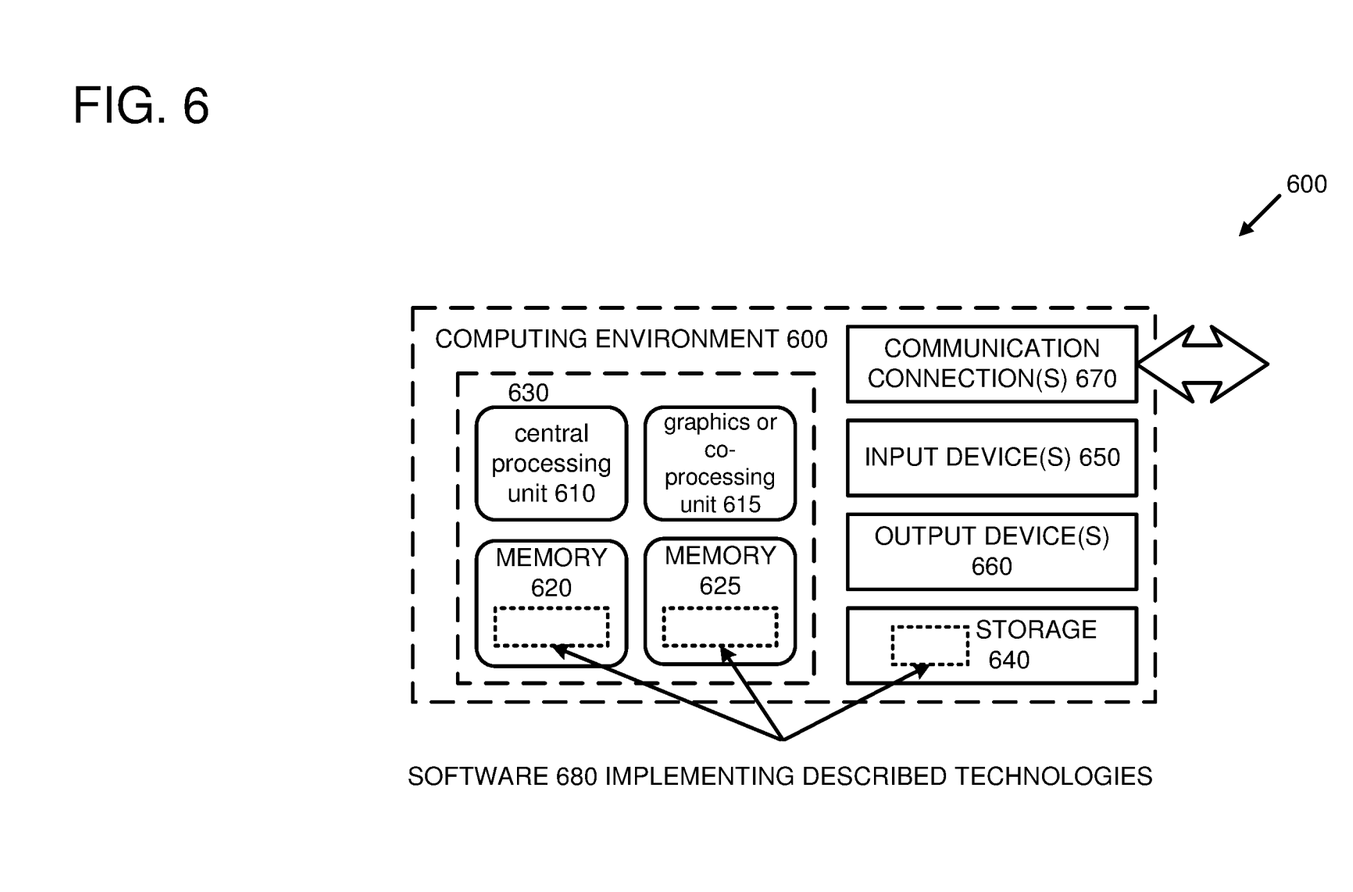
FIG. 6 is a diagram depicting a generalized example of a suitable computing environment in which the described innovations may be implemented.

FIG. 6 depicts a generalized example of a suitable computing environment 600 in which the described innovations may be implemented. The computing environment 600 is not intended to suggest any limitation as to scope of use or functionality, as the innovations may be implemented in diverse general-purpose or special-purpose computing systems. For example, the computing environment 600 can be any of a variety of computing devices (e.g., desktop computer, laptop computer, server computer, tablet computer, etc.).

With reference to FIG. 6, the computing environment 600 includes one or more processing units 610, 615 and memory 620, 625. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 can store software 680 implementing one or more innovations described herein, (for example, in the form of computer-executable instructions suitable for execution by the processing unit(s)).

In at least some embodiments, the computing environment 600 can comprise a computing device or host computer as described herein.

In at least some embodiments, one or more of the memories 620, 625 can comprise a memory device as described herein. Additionally or alternatively, one or more of the memories 620,625 can comprise a plurality of memory cells that can be accessed by a memory controller as described herein.

A computing system may have additional features. For example, the computing environment 600 includes storage 640, one or more input devices 650, one or more output devices 660, and one or more communication connections 670. An interconnection mechanism (not shown) such as a bus, controller, or network interconnects the components of the computing environment 600. Typically, operating system software (not shown) provides an operating environment for other software executing in the computing environment 600, and coordinates activities of the components of the computing environment 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing environment 600. The storage 640 can store instructions for the software 680 implementing one or more innovations described herein (for example in a storage medium and/or firmware of the storage 640).

The input device(s) 650 may be a touch input device such as a keyboard, mouse, pen, or trackball, a voice input device, a scanning device, or another device that provides input to the computing environment 600. The output device(s) 660 may be a display, printer, speaker, CD-writer, or another device that provides output from the computing environment 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, assembly language, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-Specific Integrated Circuits (ASICs), Program-Specific Standard Products (ASSPs), System-On-a-Chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A random access memory device comprising:
a plurality of memory cells, organized in one or more logical data units, configured to store bits of data; and
a memory controller configured to:
detect an uncorrectable error in data stored in a plurality of memory cells of a first logical data unit of the one or more logical data units,
responsive to detecting the uncorrectable error, write bits of data conforming to a data pattern to the plurality of memory cells with the detected uncorrectable error,
read bits of data stored in the plurality of memory cells with the detected uncorrectable error,
identify a memory cell, of the plurality of memory cells with the detected uncorrectable error, that is a cause of the uncorrectable error based on a difference between the bits of data conforming to the data pattern and the bits of data read from the plurality of memory cells with the detected uncorrectable error,
transmit a message to a host computer connected to the random access memory device, reporting the identified memory cell,
receive a command from the host computer to perform a post-package repair operation targeting the identified memory cell, and
infer, based on the identifying the memory cell, that bad memory cells exist in a second logical data unit of the one or more logical data units, and
write bits of data conforming to the data pattern to memory cells in the second logical data unit and read data back from the written memory cells in the second logical data unit to confirm whether bad memory cells exist in the second logical data units.

2. The random access memory device of claim 1, wherein the memory controller is further configured to avoid a use of the identified memory cell in a future data storage operation.

3. The random access memory device of claim 1, further comprising a dynamic random access memory module that comprises the plurality of memory cells and the memory controller.

4. The random access memory device of claim 1, wherein:
the random access memory device is an error-correcting code (ECC) memory device; and
the uncorrectable error is an error that cannot be corrected using an ECC.

5. A method, comprising:
detecting an uncorrectable error in data stored in a plurality of memory cells of a first logical data unit of a random access memory device;
responsive to the detecting the uncorrectable error, writing test data to the plurality of memory cells with the detected uncorrectable error;
reading data from the plurality of memory cells with the detected uncorrectable error;
identifying a bad memory cell, of the plurality of memory cells with the detected uncorrectable error, that is a cause of the uncorrectable error based on a difference between the data read from the plurality of memory cells with the detected uncorrectable error and the test data;
performing a post-package repair operation targeting the bad memory cell, and
inferring, based on the identifying the bad memory cell, that bad memory cells exist in a second logical data unit of the random access memory device, and
writing the test data to memory cells in the second logical data unit and reading data back from the written memory cells in the second logical data unit to confirm whether bad memory cells exist in the second logical data units.

6. The method of claim 5, further comprising:
preventing use of the bad memory cell in a subsequent operation to store data in the random access memory device.

7. The method of claim 5, wherein the post-package repair operation is performed subsequent to a reboot of the random access memory device.

8. The method of claim 5, wherein:
the writing the test data comprises writing a series of ones to the plurality of memory cells; and
the identifying the bad memory cell comprises identifying a memory cell, of the plurality of memory cells, associated with a zero value in the data read from the plurality of memory cells.

9. The method of claim 5, wherein the detecting the uncorrectable error comprises detecting an error that cannot be corrected using an error-correcting code.

10. The method of claim 5, further comprising:
transmitting a message to an operating system of a host computer connected to the random access memory device, the message identifying the bad memory cell.

11. A system, comprising:
a random access memory device comprising a plurality of memory cells, organized in one or more logical data units, configured to store bits of data; and
a memory controller configured to:
detect an uncorrectable error in data stored in the plurality of memory cells of a first logical data unit of the one or more logical data units,
responsive to the detecting the uncorrectable error, write a bit pattern to the plurality of memory cells with the detected uncorrectable error,
read data from the plurality of memory cells with the detected uncorrectable error,
identify a bad memory cell, of the plurality of memory cells with the detected uncorrectable error, that is a cause of the uncorrectable error based on a difference between the data read from the plurality of memory cells with the detected uncorrectable error and the bit pattern, and
perform a repair operation targeting the bad memory cell.

12. The system of claim 11, further comprising:
a host computer connected to the memory controller; and
wherein the memory controller is further configured to transmit a message to the host computer comprising an identity of the bad memory cell.

13. The system of claim 12, wherein the host computer is configured to omit the bad memory cell from a future data write operation targeting the plurality of memory cells.

14. The system of claim 13, wherein:
the plurality of memory cells are organized into multiple cache lines; and
the omitting the bad memory cell comprises omitting a cache line comprising the bad memory cell from the future data write operation.

15. The system of claim 11, further comprising:
a boot firmware connected to the memory controller; and
wherein the memory controller is configured to transmit a message comprising an identity of the bad memory cell to the boot firmware.

16. The system of claim 15, wherein the boot firmware is configured to transmit a command to the memory controller to perform the repair operation targeting the bad memory cell.

17. The system of claim 16, wherein the boot firmware is configured to transmit the command to the memory controller as part of a reboot operation.

18. The system of claim 11, wherein the detecting the uncorrectable error comprises detecting that an error that cannot be corrected using an error-correcting code.

* * * * *

UNITED STATES PATENT AND TRADEMARK OFFICE
CERTIFICATE OF CORRECTION

| | |
|---|---|
| PATENT NO. | : 11,404,135 B1 |
| APPLICATION NO. | : 16/792770 |
| DATED | : August 2, 2022 |
| INVENTOR(S) | : Jonathan Parker |

It is certified that error appears in the above-identified patent and that said Letters Patent is hereby corrected as shown below:

In the Claims

Column 13,
Line 20, "detecting that an error" should be --detecting an error--.

Signed and Sealed this
Sixth Day of June, 2023

Katherine Kelly Vidal
*Director of the United States Patent and Trademark Office*